United States Patent
Wang et al.

(10) Patent No.: US 8,247,297 B2
(45) Date of Patent: Aug. 21, 2012

(54) METHOD OF FILLING LARGE DEEP TRENCH WITH HIGH QUALITY OXIDE FOR SEMICONDUCTOR DEVICES

(75) Inventors: Xiaobin Wang, San Jose, CA (US); Anup Bhalla, Santa Clara, CA (US); Yeeheng Lee, San Jose, CA (US)

(73) Assignee: Alpha & Omega Semiconductor Inc., Sunnyvale, CA (US)

( * ) Notice: Subject to any disclaimer, the term of this patent is extended or adjusted under 35 U.S.C. 154(b) by 276 days.

(21) Appl. No.: 12/637,988

(22) Filed: Dec. 15, 2009

(65) Prior Publication Data

US 2011/0140228 A1    Jun. 16, 2011

(51) Int. Cl.
*H01L 21/336* (2006.01)
*H01L 21/8238* (2006.01)

(52) U.S. Cl. ........ 438/270; 438/207; 438/218; 438/219; 438/294

(58) Field of Classification Search .................. 438/207, 438/218, 219, 270, 294
See application file for complete search history.

(56) References Cited

U.S. PATENT DOCUMENTS

| | | | |
|---|---|---|---|
| 6,309,929 B1 * | 10/2001 | Hsu et al. | 438/270 |
| 2006/0118833 A1 * | 6/2006 | Lanois | 257/256 |

* cited by examiner

*Primary Examiner* — Long Tran
(74) *Attorney, Agent, or Firm* — Chein-Hwa Tsao; Chemily LLC (57) ABSTRACT

A method is disclosed for creating a semiconductor device structure with an oxide-filled large deep trench (OFLDT) portion having trench size TCS and trench depth TCD. A bulk semiconductor layer (BSL) is provided with a thickness BSLT>TCD. A large trench top area (LTTA) is mapped out atop BSL with its geometry equal to OFLDT. The LTTA is partitioned into interspersed, complementary interim areas ITA-A and ITA-B. Numerous interim vertical trenches of depth TCD are created into the top BSL surface by removing bulk semiconductor materials corresponding to ITA-B. The remaining bulk semiconductor materials corresponding to ITA-A are converted into oxide. If any residual space is still left between the so-converted ITA-A, the residual space is filled up with oxide deposition. Importantly, the geometry of all ITA-A and ITA-B should be configured simple and small enough to facilitate fast and efficient processes of oxide conversion and oxide filling.

11 Claims, 7 Drawing Sheets

Fig. 1A-1 Present Invention

Fig. 1B-1 Present Invention

Fig. 2A-0 Present Invention

Fig. 2A Present Invention

Fig. 2B Present Invention

Fig. 2C Present Invention

Fig. 4 Prior Art

METHOD OF FILLING LARGE DEEP TRENCH WITH HIGH QUALITY OXIDE FOR SEMICONDUCTOR DEVICES

CROSS REFERENCE TO RELATED APPLICATIONS

1. Field of Invention

This invention relates generally to the field of power semiconductor device structure and fabrication. More specifically, the present invention is directed to fabrication method for large deep oxide trench of a power semiconductor device structure.

2. Background of the Invention

Power semiconductor devices have many industrial applications, such as power amplifiers, power convertors, low noise amplifiers and digital Integrated Circuits (IC) to name a few. Some examples of power semiconductor devices are Schottky diode, Metal-Oxide-Semiconductor Field Effect Transistor (MOSFET), Insulated Gate Bipolar Transistor (IGBT) and double diffused Metal-Oxide-Semiconductor Transistor (DMOS). The termination structure of power semiconductor devices often requires a high quality semiconductor oxide layer such as silicon oxide. For medium to high voltage devices, a high quality semiconductor oxide layer that is both deep and wide (for example, of the order of ten microns) is often required to insure a high breakdown voltage $V_{bk}$ and low leakage current $I_{lk}$. While semiconductor oxide layers of thickness around 1 micron can be thermally formed or deposited, it can take more than two hours process time already just to form a 0.5 micron thick thermal oxide. Besides being of lower quality, a deposited oxide thickness of a few microns is already considered quite thick in that its dielectric property non-uniformity can be a problem. Manufacturing issues with forming a deep and wide oxide filled trench include: processing time, non-uniformity, and high stress levels.

Figure 4:
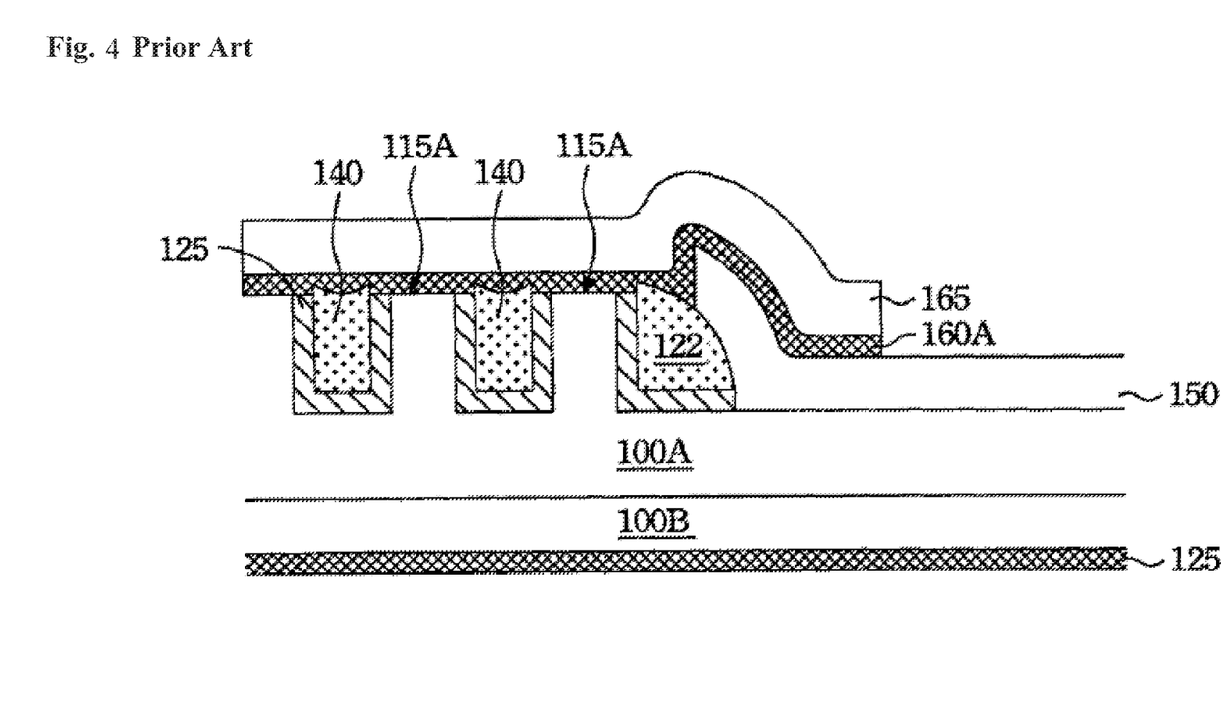
FIG. 4 illustrates a prior art power semiconductor device termination structure with an integrated dielectric layer for sustaining a high voltage drop across it.

FIG. 4 illustrates a prior art termination structure disclosed in U.S. Pat. No. 6,309,929 entitled "METHOD OF FORMING TRENCH MOS DEVICE AND TERMINATION STRUCTURE" by Hsu et al and granted on Oct. 30, 2001. The simultaneously fabricated trench MOS device, located to the left of the termination structure, is not shown here to avoid unnecessary obscuring details. The termination structure includes a number of Schottky diodes formed between an anode electrode 160A (delimited by a photoresist pattern 165) and first semiconductor layer 100A at numerous mesa surface locations 115A. The Schottky diodes are, through the anode electrode 160A, electrically connected to a number of MOS structures made of first conductive layer 140, gate oxide layer 125 and the first semiconductor layer 100A. The MOS structures include a poly spacer 122 bordering an important dielectric layer 150 for sustaining a high voltage drop between second substrate 100B and the anode electrode 160A. In an embodiment, the dielectric layer 150 is a termination oxide directly formed upon a trench. Either thermally grown or deposited, the so formed termination oxide thickness is limited to only about 0.2 micron to about several microns due to manufacturing equipment tooling and silicon-oxide interface stress limitations. So the formation of deep and wide high quality semiconductor oxide layer under this prior art can be an issue.

In a paper entitled "Feasibility study of a junction termination using deep trench isolation technique for the realization of DT-SJMOSFETs" published in Proceedings of the 20th International Symposium on Power Semiconductor Devices & IC's, May 18-22, 2008, Orlando, Fla. by Mahfoz-Kotb et al, an alternative dielectric material called BenzoCycloButene (BCB) was tried in lieu of semiconductor oxide for deep trench fill. Besides complicating the associated device fabrication process with an added new material (BCB), the resulting dielectric material quality was found to be inferior compared to thermal oxide. Thus, there is an ongoing need of fabricating high quality trench semiconductor oxide layer that is both deep and wide without incurring a high thermal budget and with good production throughput.

SUMMARY OF THE INVENTION

A method is disclosed for creating a semiconductor device structure with an oxide-filled large deep trench (OFLDT) portion having trench size TCS and trench depth TCD. The method includes:

a) Provide a bulk semiconductor layer (BSL) with a thickness BSLT>TCD. Map out a large trench top area (LTTA) atop the BSL with its geometry equal to that of OFLDT.

b) Partition the LTTA into interspersed, complementary interim areas ITA-A and ITA-B each of pre-determined geometry.

c) Create a number of interim vertical trenches till the depth TCD into the top BSL surface so as to remove bulk semiconductor materials corresponding to ITA-B.

d) Convert, via thermal oxidation, the remaining bulk semiconductor materials corresponding to ITA-A into oxide. Afterwards, if there is still any residual space left between the so-converted ITA-A, fill up the residual space with oxide deposition.

e) Planarize, via chemical mechanical polishing (CMP), the top surface as desired for any additional processing.

In a more specific important embodiment, the geometry of all partitioned ITA-A and ITA-B should be configured to be simple and small enough so as to facilitate:

d1) A fast and efficient process of converting the remaining bulk semiconductor materials corresponding to ITA-A into high quality oxide.

d2) A fast and efficient process of filling the residual space with high quality oxide.

In a related embodiment of application involving coexisting active trench devices, the step of creating a number of interim vertical trenches can be expanded to simultaneously create a number of deep active device trenches in an active device trench top area ADTTA mapped out atop the BSL and separate from the LTTA. As a result, the step of converting the remaining bulk semiconductor materials corresponding to ITA-A into oxide also simultaneously converts a surface portion of the deep active device trench walls into oxide. Next, the top surface is planarized and the converted oxide in the ADTTA can be selectively and partially etched down, through a correspondingly windowed mask, to leave a liner oxide upon the deep active device trenches.

As an alternative to the above after simultaneous creation of the interim vertical trenches and the deep active device trenches:

An interim oxidation prevention layer, for example silicon nitride, can be selectively formed upon the deep active device trenches.

The remaining bulk semiconductor materials corresponding to ITA-A can then be selectively converted into oxide. Afterwards, if there is still any residual space left between the so-converted ITA-A, fill up the residual space with oxide deposition.

Finally, the interim oxidation prevention layer is removed and a liner oxide can be formed upon the now exposed deep active device trenches.

As a refinement, the step of creating the deep active device trenches and the interim vertical trenches includes:
1. Anisotropically etch out most volumetric portion of the deep active and interim vertical trenches.
2. Isotropically etch out small remaining volumetric portion of the deep active and interim vertical trenches thus causing them to have rounded corners to facilitate subsequent processing.

In a more specific embodiment, the shape of each ITA-A can be made into a square, rectangle, circle, ellipse, hexagon or polygon. The size of each ITA-A is from about 0.5 micron to about 5 microns and the size of each ITA-B is from about 0.4 micron to about 3 microns. However it may be desirable for the cell pitch of the interim trenches (ITA-A plus ITA-B) to be similar to the cell pitch of the active area device cells. (e.g., within +/−75%). TCS is from about 10 micron to about 100 micron and TCD is from about 10 micron to about 50 micron. However there is really no limit to how wide TCS can be, and TCD may certainly be made less than 10 microns should the application call for it. In order to easily fill the remaining gaps after thermal oxidation, ITA-A and ITA-B should be sized such that after thermal oxidation, the remaining gap in the interim trenches is less than 4 microns.

In essence, this invention shows how to form a wide and deep oxide trench comprising vertical ribs made of thermal oxide interspersed throughout the wide oxide trench. Any remaining gaps in the wide oxide trench between the oxide ribs may be filled with insulating material such as deposited oxide. The wide and deep oxide trench can function as a termination trench for a semiconductor device. The oxide ribs may contain a small notch at their bottoms.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative:

FIG. 1A, FIG. 1A-1, FIG. 1A-2, FIG. 1B, FIG. 1B-1 and FIG. 1B-2 are top views and some associated process steps of two bulk semiconductor layers illustrating a present invention idea of creating interspersed semiconductor pillars and interim vertical trenches within a large trench top area for large deep trench oxide;

FIG. 2A-0, FIG. 2A, FIG. 2B, FIG. 2C, FIG. 2D and FIG. 2E illustrate a first embodiment method under the present invention of simultaneously creating a semiconductor device structure with an oxide-filled large deep trench portion and another portion of deep active device trenches.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1A:
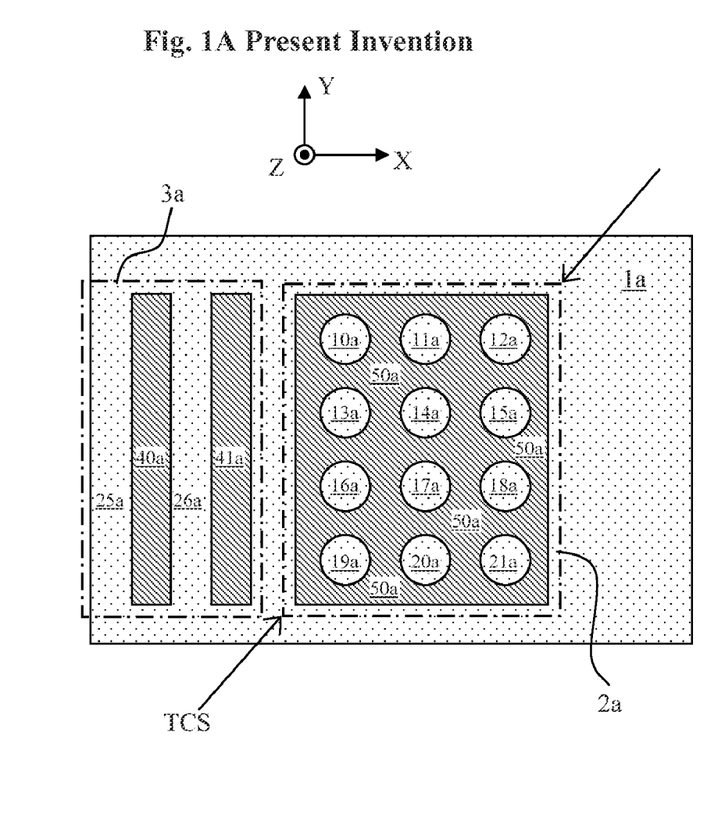
Figure 1A:
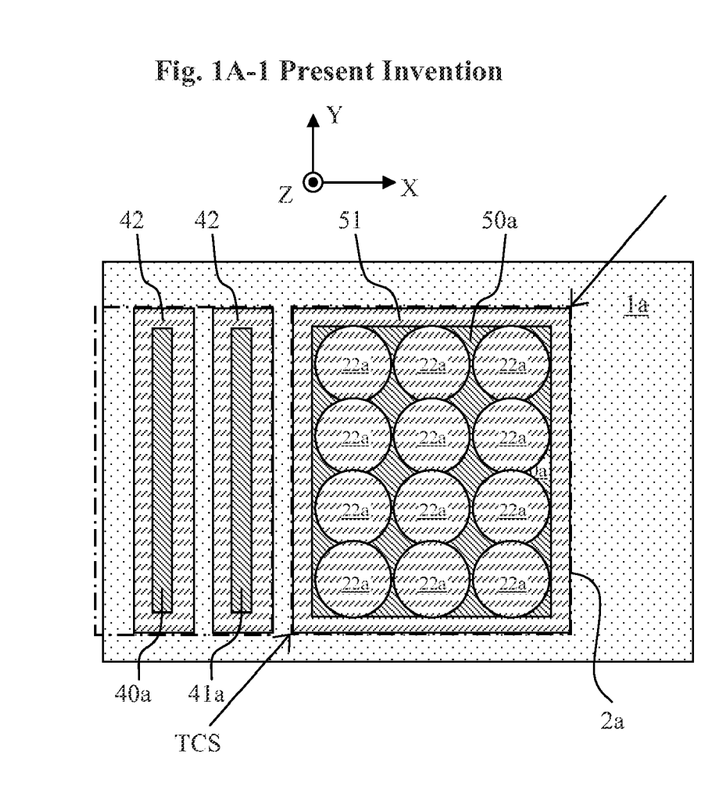
Figure 1A:
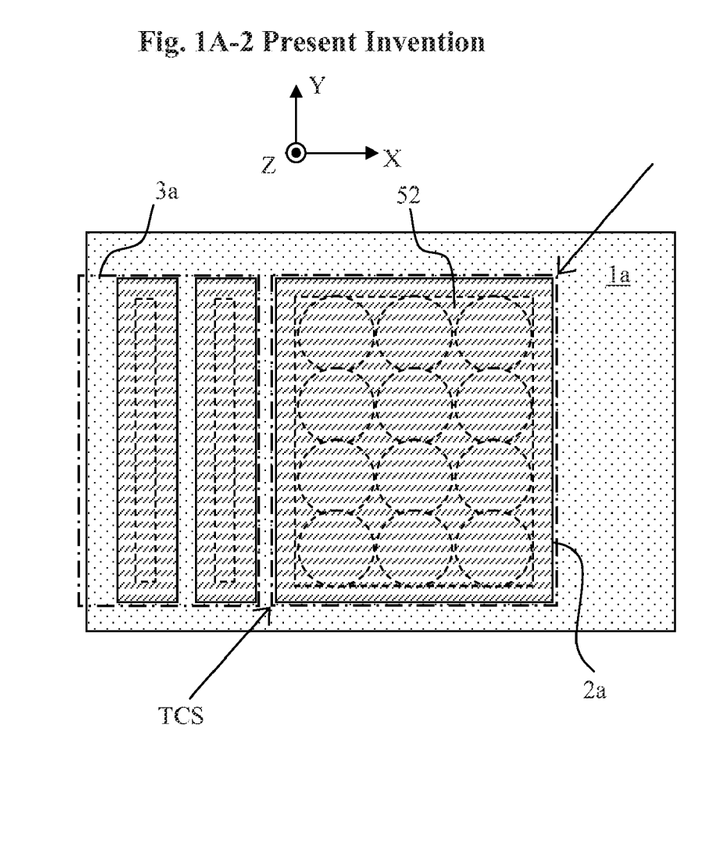
Figure 1B:
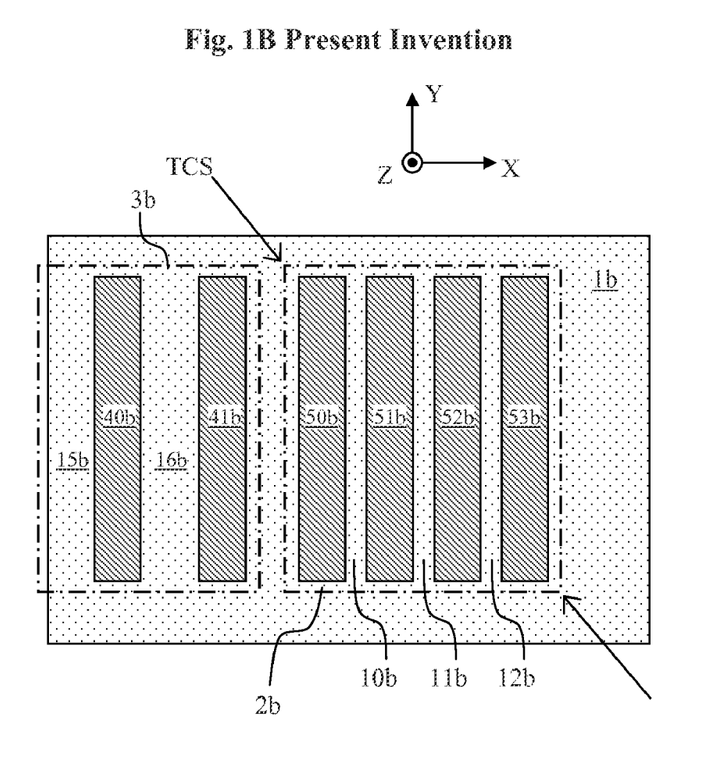
Figure 1B:
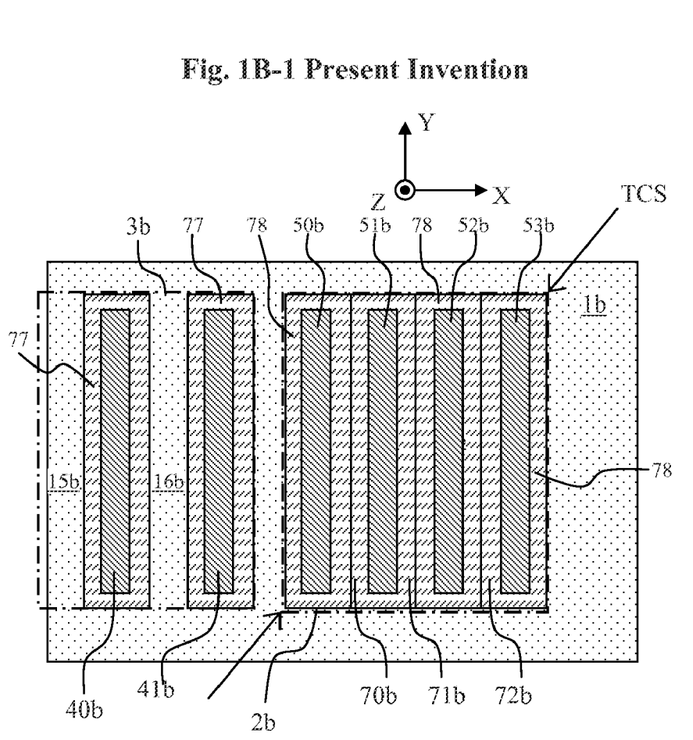

FIG. 1A, FIG. 1A-1, FIG. 1A-2, FIG. 1B, FIG. 1B-1 and FIG. 1B-2 are top views and some associated process steps of two bulk semiconductor layers illustrating a present invention idea of creating interspersed semiconductor pillars and interim vertical trenches within a large trench top area for large deep trench oxide. FIG. 1A and FIG. 1B are top views of two bulk semiconductor layers (BSL) 1a and BSL 1b. While not visible in these views, both BSL 1a and BSL 1b have a bulk semiconductor layer thickness (BSLT) along the Z-axis. The top surface of BSL 1a in FIG. 1A is mapped into a large trench top area (LTTA) 2a for an oxide-filled large deep trench (OFLDT) of trench size TCS and trench depth TCD and an active device trench top area ADTTA 3a for active device trenches. The top surface geometry of LTTA 2a is made roughly equal to that of OFLDT. The LTTA is slightly smaller than the area of the OFLDT to take into account the thermal oxidation step later in the process. Selected portions of the bulk semiconductor materials within BSL 1a are anisotropically removed to create an interim vertical trench 50a interspersed with a number of remaining semiconductor pillars 10a, 11a, 12a, . . . , 21a. While also invisible, the interim vertical trench 50a is made with a trench depth TCD<BSLT. Selected portions of the bulk semiconductor materials within the active device trench top area ADTTA 3a may also be anisotropically removed to create a desired number of deep active device trenches 40a, 41a separated by active device semiconductor mesas 25a, 26a as illustrated. In practice, the creation of interim vertical trench 50a and deep active device trenches 40a, 41a can be carried out in separate steps for individually selectable trench depths or carried out simultaneously for the same trench depth and lower cost. As shown in FIG. 1A-1, the remaining bulk semiconductor materials of semiconductor pillars 10a, 11a, 12a, . . . , 21a are then converted into semiconductor oxide, e.g., by thermal oxidation, to form oxide pillars 22. This oxidation process also converts the exposed sidewalls of the trenches 40a, 41a, and 50a to sidewall oxides 42, 51. Afterwards, if there is still any residual space left between the so-converted semiconductor oxide pillars, the residual space can be filled up with oxide deposition thus completing the OFLDT 52 as shown in FIG. 1A-2.

Figure 1B:
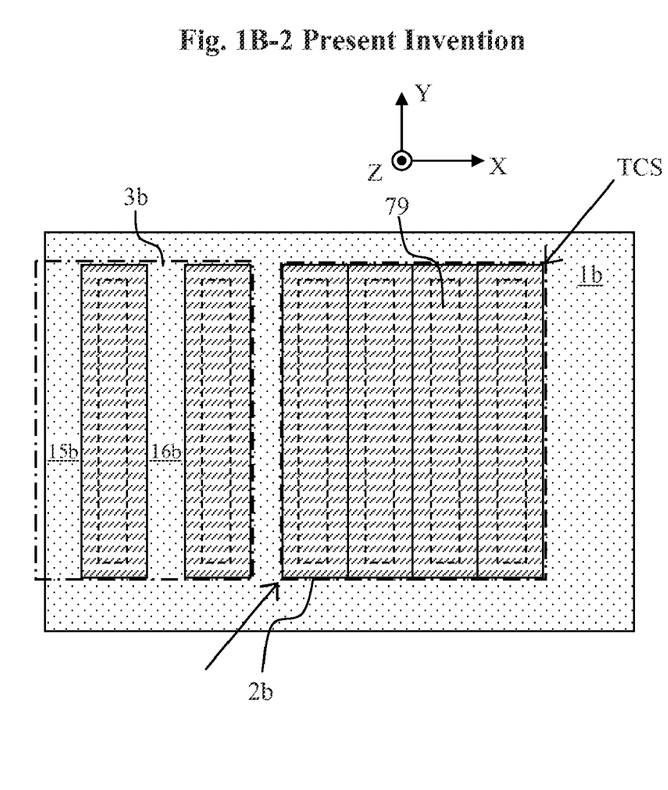

The top surface of BSL 1b in FIG. 1B is mapped into an LTTA 2b for an oxide-filled large deep trench (OFLDT) of trench size TCS and trench depth TCD and an ADTTA 3b for active device trenches. The top surface geometry of LTTA 2b is made equal to that of OFLDT. Selected portions of the bulk semiconductor materials within BSL 1b are anisotropically removed to create interim vertical trenches 50b, 51b, 52b, 53b interspersed with a number of remaining semiconductor mesas 10b, 11b, 12b. In a separate area, selected portions of the bulk semiconductor materials within the ADTTA 3b are also anisotropically removed to create a desired number of deep active device trenches 40b, 41b separated by active device semiconductor mesas 15b, 16b as illustrated. In practice, the creation of interim vertical trenches 50b, 51b, 52b, 53b and deep active device trenches 40b, 41b can be carried out in separate steps for individually selectable trench depths or carried out simultaneously for the same trench depth. The remaining bulk semiconductor materials of semiconductor mesas 10b, 11b, 12b are then converted into semiconductor oxide, e.g., by thermal oxidation, to form converted oxides 70b, 71b, 72b. This oxidation process also converts the exposed sidewalls of the trenches 40b, 41b, and 50b, 51b, 52b, 53b to sidewall oxides 77, 78. Afterwards, if there is still any residual space left between the so-converted semiconductor oxide mesas, the residual space can be filled up with oxide deposition thus completing the OFLDT 79, as shown in FIG. 1B-2. By way of example, the oxidation deposition may be planarized back to the semiconductor surface. These process steps will be explained more thoroughly below.

Figure 2A:
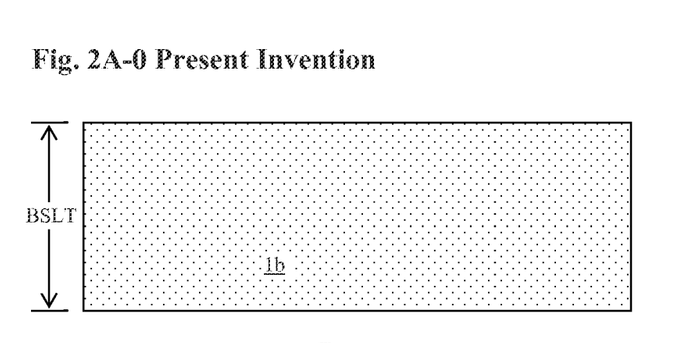
Figure 2A:
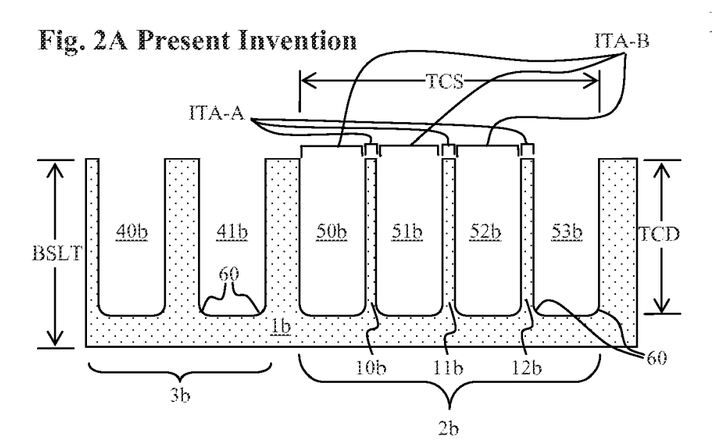

FIGS. 2A-0, FIG. 2A, FIG. 2B, FIG. 2C, FIG. 2D and FIG. 2E illustrate, via side cross sectional views, a detailed first embodiment method under the present invention of simultaneously creating a semiconductor device structure with an oxide-filled large deep trench portion and another portion of deep active device trenches. In FIGS. 2A-0, a bulk semiconductor layers (BSL) 1b of thickness BSLT is provided. In FIG. 2A, with the previously mentioned interspersed, complementary interim areas ITA-A and ITA-B shown as labeled, the BSL 1b is mapped into a LTTA 2b atop the BSL with its geometry and size TCS roughly equal to that of OFLDT. The top surface of BSL 1b is then anisotropically etched to a depth TCD<BSLT through a windowed mask to create, within the LTTA 2b, interim vertical trenches 50b, 51b, 52b, 53b interspersed with a number of remaining semiconductor mesas 10b, 11b, 12b. These figures are not to scale, as the BSLT is usually many times thicker than the TCD. The ADTTA 3b is also anisotropically etched through a windowed mask to create a desired number of deep active device trenches 40b, 41b separated by active device semiconductor mesas 15b, 16b. Notice the appearance of rounded corners 60 at the bottom of the interim vertical trenches and the deep active device trenches. As will be presently explained, these rounded corners 60 serve to facilitate corner coverage of subsequent processing steps. The rounded corners 60 may also help improved breakdown voltages, by reducing electric field crowding due to sharp curvatures. The rounded corners 60 can be created with the following steps:

1. Anisotropically etch out most volumetric portion of the interim vertical and deep active trenches.
2. Isotropically etch out small remaining volumetric portion of the interim vertical and deep active trenches thus causing them to have rounded corners.

Figure 2B:
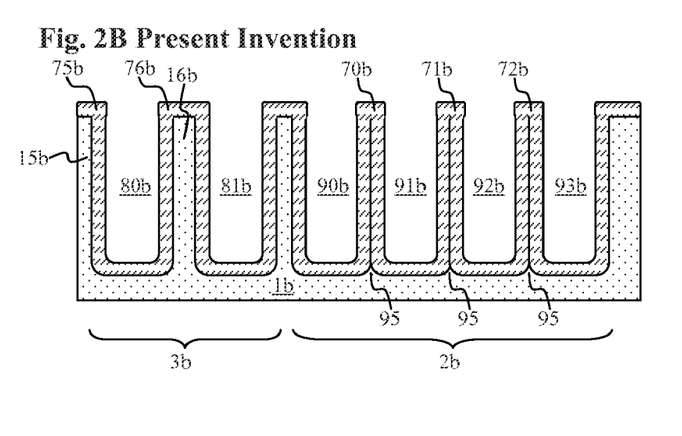
Figure 2C:
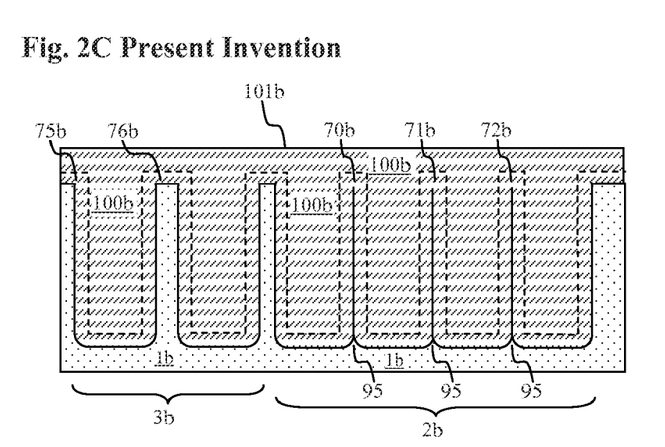

FIG. 2B illustrates the completed conversion of bulk semiconductor materials of the remaining semiconductor mesas 10b, 11b, 12b and trench sidewalls respectively into converted oxides 70b, 71b, 72b and 68b and 69b separated by residual spaces 90b, 91b, 92b, 93b. The conversion can be carried out through thermal oxidation resulting in, for example, a silicon dioxide layer thickness from 2500 Angstrom ~5000 Angstrom. Notice that due to substantial difference of molecular volumetric density between the semiconductor material and its oxide, the size of the converted oxides 70b, 71b, 72b has "grown" to be substantially bigger than their predecessor semiconductor mesas 10b, 11b, 12b. Notice that at the bottom of the converted oxides 70b, 71b, 72b there may be residual notches 95 where the oxides at the bottom of the trenches meet. Simultaneously, the same oxide conversion process has also converted the surface portion of the much larger sized (relative to the semiconductor mesas 10b-12b) active device semiconductor mesas 15b, 16b into converted oxides 75b and 76b separated by residual spaces 80b, 81b. It is important to point out that, had the various interim vertical trenches 50b, 51b, 52b, 53b of FIG. 2A been alternatively made sufficiently smaller (i.e., narrower along X-direction) than indicated there, the growth of the converted oxides 70b, 71b, 72b would have completely joined their neighbors within the LTTA 2b with no residual space left thus completing a large deep oxide trench with depth TCD and size TCS already. FIG. 2C illustrates the completion of filling up the residual spaces (90b, 91b, 92b, 93b) and (80b, 81b) with deposited fill oxide 100b up to a fill oxide surface 101b thus completing a large deep oxide trench with depth TCD and size TCS as well. The residual spaces (90b, 91b, 92b, 93b) are sized so that they can be easily filled with oxide or another suitable material. The active and termination regions are carefully designed, so that after the semiconductor mesas 10b, 11b, 12b are converted to converted oxides 70b, 71b, 72b, the active and termination region have the same or similar trench density, or cell pitch, in which case high quality HDP (High Density Plasma) oxide deposition can easily fill the residual spaces (90b, 91b, 92b, 93b). HDP oxide deposition cannot be used to fill a very wide gap due to tooling and stress limitations, which is why this invention divides an eventual wide trench into small trenches. In an alternative embodiment, a different insulating material may be used in place of fill oxide 100b.

Thus, by dividing an LTTA 2b, designated for an OFLDT of trench size TCS and trench depth TCD, into numerous interspersed complementary interim semiconductor mesas 10b-12b and interim vertical trenches 50b-53b with both mesa and trench sizes being much smaller than TCS, the present invention can indirectly create the OFLDT with complementary converted oxides and deposited oxides while avoiding quality problems arising from an otherwise direct creation of the OFLDT. The cross sectional geometry of all interim semiconductor mesas and interim vertical trenches should be configured to be simple (to avoid dead corners) and small enough so as to facilitate:

1. A fast and efficient oxide conversion process (FIG. 2B).
2. A fast and efficient oxide filling process (FIG. 2C).

As for some specific examples, the cross sectional shape of each interim semiconductor mesa can be made into a square, rectangle, circle, ellipse, hexagon or polygon or any other suitable shape. The cross sectional size of each interim semiconductor mesa can be from about 0.5 micron to about 4 microns and the cross sectional size of each interim vertical trench can be from about 0.4 micron to about 3 micron. Ideally the cell pitch of the interim vertical trenches are similar to the cell pitch of the active cell devices, e.g. within +/−75%. This helps for the oxide deposition step to be more uniform which in turn aids the planarization step. Correspondingly, the resulting TCS can be from about 10 micron to about 100 micron and TCD can be from about several microns to about 50 micron. Furthermore, the process throughput of the present invention can be made higher by partitioning the LTTA 2b for a higher surface area-to-volume ratio of both the interim semiconductor mesas and the interim vertical trenches. To those skilled in the art, by now it should become clear that the aforementioned rounded corners 60 at the bottom of the interim vertical trenches and the deep active device trenches serve to facilitate corner coverage of both the oxide conversion step and the oxide filling step, and to improve the electric field characteristics.

Figure 2D:
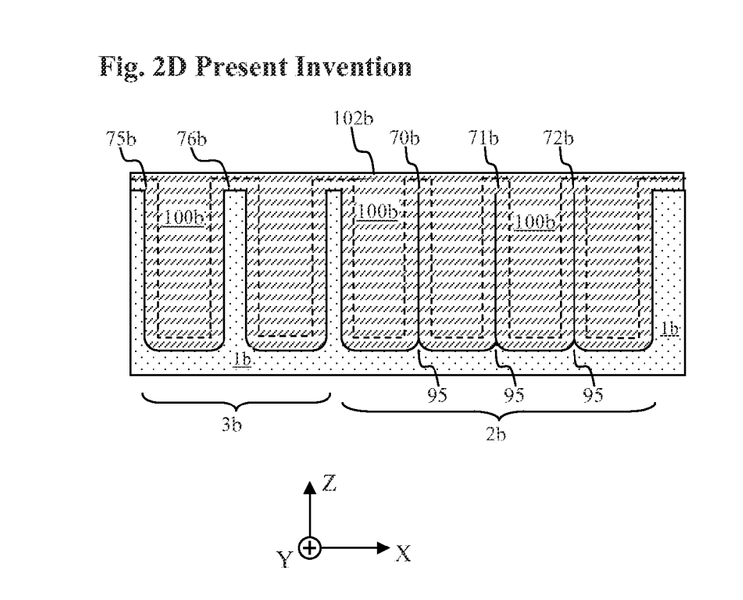
Figure 2E:
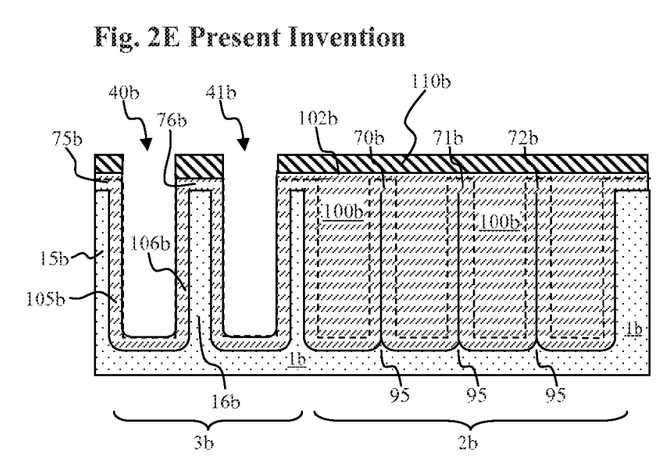

FIG. 2D illustrates the planarization, via chemical mechanical polishing (CMP) for example, of the fill oxide surface 101b (FIG. 2C) down to a planarized fill oxide surface 102b to facilitate subsequent processing. In FIG. 2E, the converted oxides 75b, 76b in the ADTTA 3b has been selectively and partially etched down, through a correspondingly windowed mask 110b, to leave liner oxides 105b, 106b upon the deep active device trenches 40b, 41b. Alternatively, all oxide in the deep active device trenches 40b, 41b can be completely removed first then thinner liner oxides can be re-grown therein if needed.

Figure 3A:
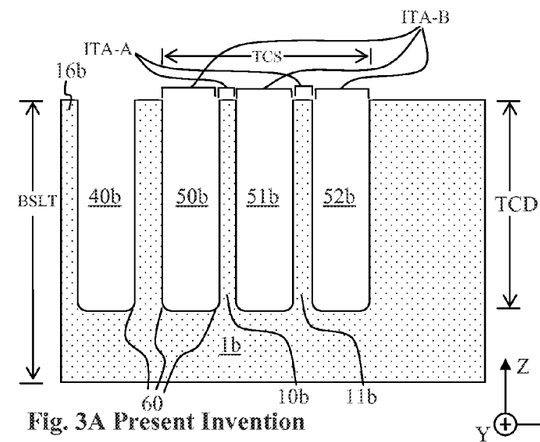
FIG. 3A through FIG. 3D illustrate a second embodiment method under the present invention of simultaneously creating a semiconductor device structure with an oxide-filled large deep trench portion and another portion of deep active device trenches.

FIG. 3A through FIG. 3D illustrate, via side cross sectional views, a detailed second embodiment method under the present invention of simultaneously creating a semiconductor device structure with an oxide-filled large deep trench portion and another portion of deep active device trenches. In FIG. 3A, with the previously mentioned interspersed, complementary interim areas ITA-A and ITA-B also shown as labeled, the top surface of BSL 1b has been anisotropically etched to a depth TCD<BSLT through a windowed mask to create, within the LTTA 2b, interim vertical trenches 50b, 51b, 52b interspersed with a number of remaining semiconductor mesas 10b, 11b. The ADTTA 3b has also been anisotropically etched through a windowed mask to create a deep active device trench 40b bounded by an active device semiconductor mesa 16b. Notice also the appearance of rounded corners 60 at the bottom of the interim vertical trenches and the deep active device trenches.

Figure 3B:
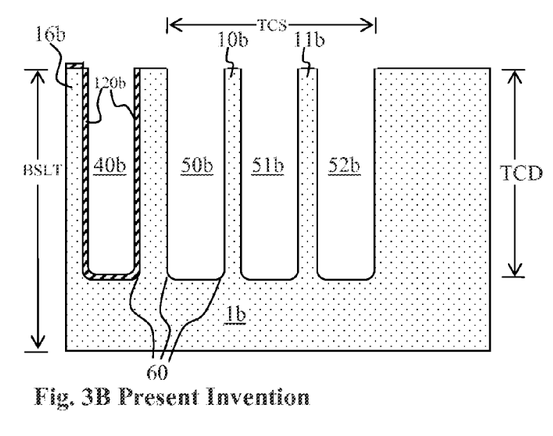

FIG. 3B illustrates the selective formation of an interim oxidation prevention layer 120b, for example silicon nitride, upon the deep active device trench 40b.

Figure 3C:
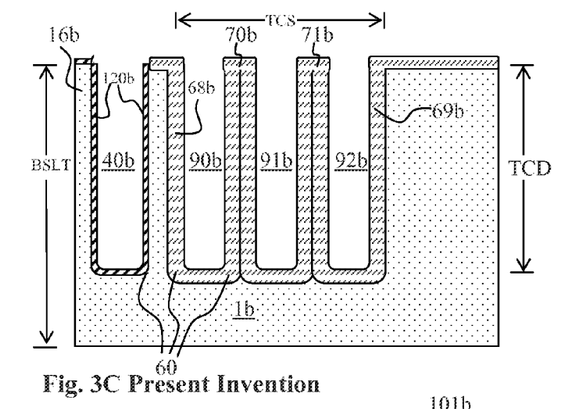

FIG. 3C illustrates, except for the bulk semiconductor materials beneath the interim oxidation prevention layer 120b within the deep active device trench 40b, the oxidation of all the exposed silicon surfaces, including the completed conversion of bulk semiconductor materials of the remaining semiconductor mesas 10b, 11b and trench sidewalls into converted oxides 70b, 71b and 68b and 69b, separated by residual spaces 90b, 91b, 92b. The conversion can be carried out through wet oxidation for example. Similar to FIG. 2B before, due to substantial difference of molecular volumetric density between the semiconductor material and its oxide, the size of the converted oxides 70b, 71b has "grown" to be substantially bigger than their predecessor semiconductor mesas 10b, 11b. Additionally, had the various interim vertical trenches 50b, 51b, 52b of FIG. 3A been alternatively made sufficiently smaller (i.e., narrower along X-direction) than indicated there, the growth of the converted oxides 70b, 71b, 72b would have completely joined their neighbors within the LTTA 2b with no residual space left thus completing a large deep oxide trench with depth TCD and size TCS already.

Figure 3D:
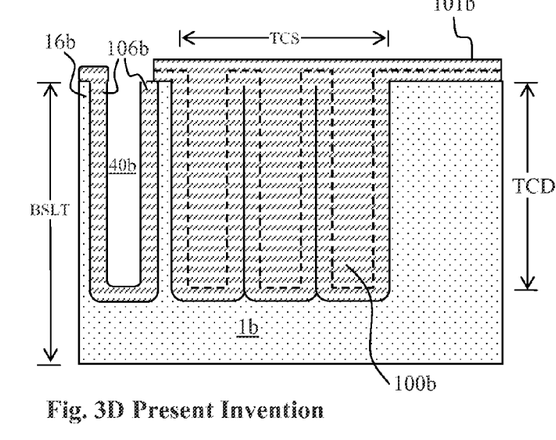

FIG. 3D illustrates:
1. The completion of filling up the residual spaces (90b, 91b, 92b) with deposited fill oxide 100b up to a fill oxide surface 101b thus completing a large deep oxide trench with depth TCD and size TCS.
2. The differential removal of the interim oxidation prevention layer 120b.
3. The formation of liner oxide 106b upon the now exposed deep active device trench 40b.

A method has been invented for making large deep trenches filled with high quality oxide for semiconductor devices. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A method of creating a semiconductor device structure with an oxide-filled large deep trench (OFLDT) portion having trench size TCS and trench depth TCD, the method comprises:
   a) providing a bulk semiconductor layer (BSL), having a thickness BSLT>TCD, and mapping out a large trench top area (LTTA) atop the BSL with its geometry equal to that of OFLDT;
   b) partitioning the LTTA into interspersed, complementary interim areas ITA-A and ITA-B each of pre-determined geometry;
   c) creating into the top BSL surface, a plurality of interim vertical trenches so as to remove bulk semiconductor materials corresponding to ITA-B till the depth TCD; and
   d) selectively forming an interim oxidation prevention layer upon the deep active device trenches; and
   e) selectively converting the remaining bulk semiconductor materials corresponding to ITA-A into oxide and, should there be any residual space left between the so-converted ITA-A, filling up the residual space with oxide;
   f) removing the interim oxidation prevention layer and forming a liner oxide upon the deep active device trenches.

2. The method of claim 1 wherein partitioning the LTTA further comprises insuring that the geometry of all ITA-A and all ITA-B are partitioned simple and small enough whereby facilitating:
   d1) a fast, efficient conversion process of the remaining bulk semiconductor into high quality oxide; and
   d2) a fast, efficient oxide filling process with high quality oxide.

3. The method of claim 1 wherein creating a plurality of interim vertical trenches further comprises:
   simultaneously creating, into the top BSL surface, a plurality of deep active device trenches in an active device trench top area ADTTA mapped out atop the BSL and separate from the LTTA.

4. The method of claim 3 wherein simultaneously creating the deep active device trenches and the interim vertical trenches comprises:
   c1) anisotropically etching out most volumetric portion of the deep active and interim vertical trenches; and
   c2) isotropically etching out small remaining volumetric portion of the deep active and interim vertical trenches whereby causing them to have rounded corners to facilitate subsequent processing.

5. The method of claim 3 wherein converting the remaining bulk semiconductor materials corresponding to ITA-A into oxide further comprises simultaneously converting:
   d1) a surface portion of the deep active device trench walls into oxide; and
   d2) the remaining bulk semiconductor materials corresponding to ITA-A into oxide.

6. The method of claim 5 further comprising, after step d),
   e) planarizing the top surface then selectively etching down the oxide in the ADTTA.

7. The method of claim 1 wherein converting the remaining bulk semiconductor materials is via thermal oxidation and filling up the residual space is via oxide deposition.

8. The method of claim 1 wherein the shape of each ITA-A is square, rectangle, circle, ellipse, hexagon or polygon.

9. The method of claim 1 wherein the size of each ITA-A is from about 0.5 micron to about 4 micron and the size of each ITA-B is from about 0.4 micron to about 3 micron.

10. The method of claim 1 wherein TCS is from about 10 micron to about 100 micron and TCD is from about 10 micron to about 50 micron.

11. The method of claim 1 wherein selectively forming the interim oxidation prevention layer comprises forming a silicon nitride.

\* \* \* \* \*